United States Patent
Moon et al.

(10) Patent No.: US 10,497,893 B2
(45) Date of Patent: Dec. 3, 2019

(54) METHOD FOR DOPING GRAPHENE, METHOD FOR MANUFACTURING GRAPHENE COMPOSITE ELECTRODE, AND GRAPHENE STRUCTURE COMPRISING SAME

(71) Applicants: LG ELECTRONICS INC., Seoul (KR); SNU R&DB FOUNDATION, Seoul (KR)

(72) Inventors: Jinsan Moon, Seoul (KR); Wonbae Park, Seoul (KR); Subeom Park, Seoul (KR); Insu Jo, Seoul (KR); Byunghee Hong, Seoul (KR)

(73) Assignees: LG ELECTRONICS INC., Seoul (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 15/563,087

(22) PCT Filed: Apr. 15, 2016

(86) PCT No.: PCT/KR2016/003910
§ 371 (c)(1),
(2) Date: Sep. 29, 2017

(87) PCT Pub. No.: WO2016/167583
PCT Pub. Date: Oct. 20, 2016

(65) Prior Publication Data
US 2018/0083220 A1 Mar. 22, 2018

(30) Foreign Application Priority Data

Apr. 15, 2015 (KR) ......................... 10-2015-0052901
Apr. 15, 2015 (KR) ......................... 10-2015-0052902

(51) Int. Cl.
*H01L 51/52* (2006.01)
*H01L 51/56* (2006.01)
(Continued)

(52) U.S. Cl.
CPC .......... *H01L 51/5215* (2013.01); *C23C 16/26* (2013.01); *C23C 16/511* (2013.01);
(Continued)

(58) Field of Classification Search
None
See application file for complete search history.

(56) References Cited

U.S. PATENT DOCUMENTS

2003/0224586 A1  12/2003  Sabnis
2012/0070612 A1   3/2012  Lee et al.
(Continued)

FOREIGN PATENT DOCUMENTS

JP       2003-306400 A   10/2003
KR   10-2005-0003363 A    1/2005
(Continued)

*Primary Examiner* — Alexander G Ghyka
(74) *Attorney, Agent, or Firm* — Birch, Stewart, Kolasch & Birch, LLP

(57) ABSTRACT

The present invention relates to graphene and, particularly, to a method for doping graphene using substrate surface modification, a method for manufacturing a graphene composite electrode using graphene and inorganic matter, and a graphene structure comprising the same. The method for doping graphene according to an embodiment of the present invention may comprise the steps of: forming, on a substrate, a precursor polymer layer for doping; and positioning graphene on the substrate on which the precursor polymer layer is formed. In addition, the method for manufacturing a graphene composite electrode according to an embodiment of the present invention may comprise the steps of: forming graphene on catalyst metal; forming a transparent conduc- (Continued)

tive oxide on the graphene; crystallizing the transparent conductive oxide by applying heat of 150° C. or higher; and transferring, to a final substrate, a composite electrode consisting of the graphene and the transparent conductive oxide.

10 Claims, 11 Drawing Sheets

(51) Int. Cl.
  *H01B 1/04* (2006.01)
  *C23C 16/511* (2006.01)
  *C23C 16/26* (2006.01)
  *H01L 51/00* (2006.01)
(52) U.S. Cl.
  CPC .............. *H01B 1/04* (2013.01); *H01L 51/003* (2013.01); *H01L 51/0021* (2013.01); *H01L 51/0097* (2013.01); *H01L 51/56* (2013.01); *H01L 2251/5338* (2013.01)

(56) References Cited

U.S. PATENT DOCUMENTS

| | | | |
|---|---|---|---|
| 2013/0022811 A1 | 1/2013 | Ahn et al. | |
| 2014/0234627 A1* | 8/2014 | Yang | ........................ H01B 1/04 428/408 |

FOREIGN PATENT DOCUMENTS

| | | |
|---|---|---|
| KR | 10-2011-0053012 A | 5/2011 |
| KR | 10-1166528 B1 | 7/2012 |
| KR | 10-2013-0000786 A | 1/2013 |
| KR | 10-1221581 B1 | 1/2013 |
| KR | 10-2013-0023941 A | 3/2013 |
| KR | 10-2013-0047804 A | 5/2013 |

\* cited by examiner

METHOD FOR DOPING GRAPHENE, METHOD FOR MANUFACTURING GRAPHENE COMPOSITE ELECTRODE, AND GRAPHENE STRUCTURE COMPRISING SAME

CROSS REFERENCE TO RELATED APPLICATIONS

This application is the National Phase of PCT International Application No. PCT/KR2016/003910, filed on Apr. 15, 2016, which claims priority under 35 U.S.C. 119(a) to Patent Application No. 10-2015-0052902, filed in Republic of Korea on Apr. 15, 2015 and No. 10-2015-0052901, filed in Republic of Korea on Apr. 15, 2015, all of which are hereby expressly incorporated by reference into the present application.

TECHNICAL FIELD

The present invention relates to graphene, and particularly to a method of doping graphene using substrate surface modification, a method of manufacturing a graphene composite electrode using graphene and an inorganic material, and a graphene structure including the same.

BACKGROUND ART

Fullerene, carbon nanotubes, graphene, graphite and the like are materials composed of carbon atoms. Thereamong, graphene has a structure composed of a single atomic layer of carbon atoms disposed in the form of a two-dimensional plane.

In particular, graphene exhibits extremely stable excellent electrical, mechanical and chemical properties as well as superior conductivity, which transfers electrons much faster than silicon and conducts much greater electricity than copper. This was demonstrated by experimentation since a method of isolating graphene from graphite was found in 2004 and a great deal of research has been conducted to date.

Such graphene draws a great deal of attention as a basic material for electrical circuits because it can be manufactured in a large area and exhibits electrical, mechanical and chemical stability as well as excellent conductivity.

In addition, generally, electrical properties of graphene change depending on grain orientation of the graphene of a predetermined thickness and thus the graphene exhibits electrical properties in a direction selected by a user and, as a result, a device can be easily designed. Accordingly, graphene can be effectively used for carbon-based electronic or electromagnetic devices and the like.

In general, application products such as display devices require a transparent electrode and extremely thick transparent conductive oxide films are used in order to maintain requirements for such a transparent electrode.

However, such thick transparent electrodes may be inapplicable to deposition on plastic substrates to manufacture flexible devices and displays and may be unsuitable in terms of transparency and low surface roughness. Thus, there is a need for an alternative to this.

Meanwhile, recently, silicon oxide dielectrics are applied to analyze device properties of graphene. In a conventional case, since p-type doping is obtained by doping the substrate, an undoped form obtained by additional heat treatment or self-assembled monolayer coating is used.

In addition, surface modification could not be generally realized because there were cases in which heat-treatment cannot be conducted or a self-assembled monolayer cannot be formed on substrates other than silicon oxide. Accordingly, there is a limitation in doping effects of graphene and an approach to solve this problem is thus needed.

DISCLOSURE

Technical Problem

One object of the present invention devised to solve the problem lies in a method of doping graphene and a graphene structure including the same.

In addition, another object of the present invention devised to solve the problem lies in a method of doping graphene using substrate surface modification and a graphene structure including the same.

Meanwhile, another object of the present invention devised to solve the problem lies in a method of manufacturing a graphene composite electrode using graphene and a transparent conductive layer.

In addition, another object of the present invention devised to solve the problem lies in a method of manufacturing a graphene composite electrode which can reduce an electrode thickness and can be applied to flexible devices and displays.

Technical Solution

The object of the present invention can be achieved by providing a method of doping graphene using substrate surface modification including forming a precursor polymer layer for doping on a substrate and disposing graphene on the substrate provided with the precursor polymer layer.

Here, the precursor polymer layer may include a precursor having a methyl group.

In this case, the precursor polymer layer may include the precursor having the methyl group as an end group.

In addition, the precursor having a methyl group may be a cyclohexane precursor.

In this case, the cyclohexane precursor may include at least one of cyclohexane, methyl cyclohexane and ethyl cyclohexane.

Here, the substrate may be a polymer substrate.

In this case, the polymer substrate may include at least one of polyethylene terephthalate (PET), triacetyl cellulose (TAC), and polycarbonate (PC).

Here, the formation of the precursor may be carried out using plasma enhanced chemical vapor deposition.

Here, the method may further include doping the graphene.

In another aspect of the present invention, provided herein is a graphene structure including a substrate, a precursor layer having a methyl group disposed on the substrate, and graphene disposed on the precursor layer.

Here, the precursor having a methyl group may include at least one of cyclohexane, methyl cyclohexane and ethyl cyclohexane.

Here, the substrate may include at least one of polyethylene terephthalate (PET), triacetyl cellulose (TAC), and polycarbonate (PC).

In another aspect of the present invention, provided herein is a method of manufacturing a graphene composite electrode including forming graphene on a catalytic metal, forming a transparent conductive oxide on the graphene, crystallizing the transparent conductive oxide by applying heat of 150° C. thereto, and transferring a composite electrode including the graphene and the transparent conductive oxide to a final substrate.

Here, the method may further include doping the graphene after forming the graphene.

Here, the crystallization may be carried out at a temperature of 150° C. to 400° C.

Here, the transparent conductive oxide may include at least one of ITO, IZO, ZnO, GZO and AZO.

Here, the transfer may include disposing a support layer on the transparent conductive oxide, removing the catalytic metal, adhering the composite electrode to the final substrate, and removing the support layer.

In addition, the transfer may include forming the final substrate on the transparent conductive oxide, and removing the catalytic metal.

Here, the final substrate may be a polymer substrate.

Here, the method may further include forming an organic EL layer on the graphene.

Effects of the Invention

The present invention has the following effects.

The graphene disposed on the surface-modified substrate can improve electrical properties. In addition, graphene can exhibit a feature of n-type doping or p-type doping.

Such a doping process can offset a decrease in conductivity caused by grain defects (defects at grain boundaries of metals) of graphene formed on a catalytic metal.

In addition, in cases where additional doping is conducted through surface modification of the substrate using the polymer layer, it is possible to maximize the effects of doping.

Meanwhile, the transparent conductive layer formed on the graphene can produce a transparent composite electrode. That is, through the organic/inorganic hybrid of the graphene and the ITO layer, a transparent composite electrode having low resistance can be formed.

Such a composite electrode is applicable to a sputtering method which is currently industrially available. This can cause a ⅕ decrease in amount of ITO used. This is because the composite electrode satisfies all of conditions for the transparent electrode although it is formed to a small thickness.

In addition, the ITO layer can function as a protection film of graphene. When the graphene is doped, the effect of doping can be maintained for a longer time.

Meanwhile, through a composite electrode of graphene as a two-dimensional material and the ITO layer, it is possible to manufacture a flexible transparent electrode. That is, the composite electrode imparts both conductivity and flexibility, thus removing limitations of flexible displays which could not be overcome only with an ITO layer.

BEST MODE

Reference will now be made in detail to the preferred embodiments of the present invention, examples of which are illustrated in the accompanying drawings.

However, the present invention allows various modifications and variations and specific embodiments thereof are exemplified with reference to the drawings and will be described in detail. The present invention should not be construed as limited to the embodiments set forth herein and includes modifications, equivalents and substitutions compliant with the spirit or scope of the present invention defined by the appended claims.

It will be understood that when an element such as a layer, area or substrate is referred to as being "on" another element, it may be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

Figure 1:
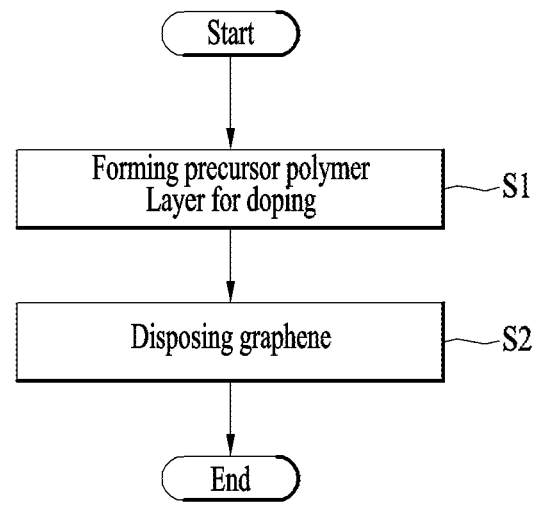
FIG. 1 is a flowchart illustrating an example of a method of doping graphene using substrate surface modification.

FIG. 1 is a flowchart illustrating an example of a method of doping graphene using substrate surface modification.

As shown in FIG. 1, the method may include forming a precursor polymer layer for doping on a substrate (S1) and disposing graphene on the substrate provided with the precursor polymer layer (S2).

Here, the precursor polymer layer may include a precursor having a methyl group ($CH_3$).

In this case, the precursor polymer layer may include a precursor having a methyl group as an end group. The precursor having a methyl group as an end group can improve conductivity of graphene by interaction between the methyl group of the precursor and the graphene or can provide conditions for doping graphene under optimal conditions. This will be described in detail later.

The precursor having a methyl group may be a cyclohexane precursor. That is, the precursor having a methyl group may include at least one of cyclohexane, methyl cyclohexane and ethyl cyclohexane.

The following Table 1 shows the structure of this cyclohexane precursor.

TABLE 1

| Name | Structure |
| --- | --- |
| Cyclohexane |  |

TABLE 1-continued

| Name | Structure |
| --- | --- |
| Methylcyclohexane | |
| Ethylcyclohexane | |

Here, the substrate may be a polymer substrate.

The polymer substrate may include at least one of polyethylene terephthalate (PET), triacetyl cellulose (TAC) and polycarbonate (PC).

Hereinafter, respective steps will be described with reference to FIG. 1 and the corresponding drawings.

Figure 2:
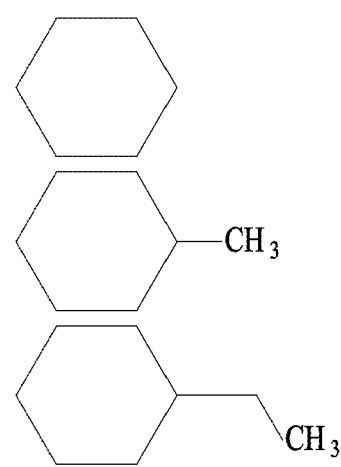
FIG. 2 is a schematic diagram showing a precursor having a methyl group as an end group.
Figure 3:
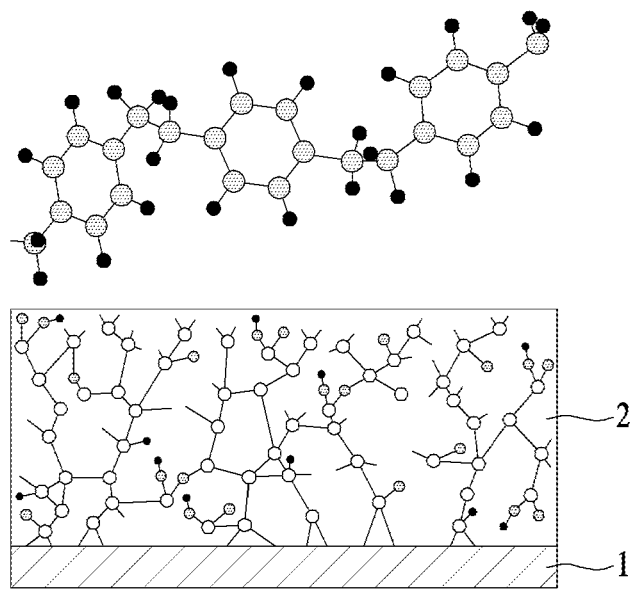
FIG. 3 and FIG. 4 are sectional schematic views illustrating an example of a method of doping graphene using substrate surface modification.
Figure 4:
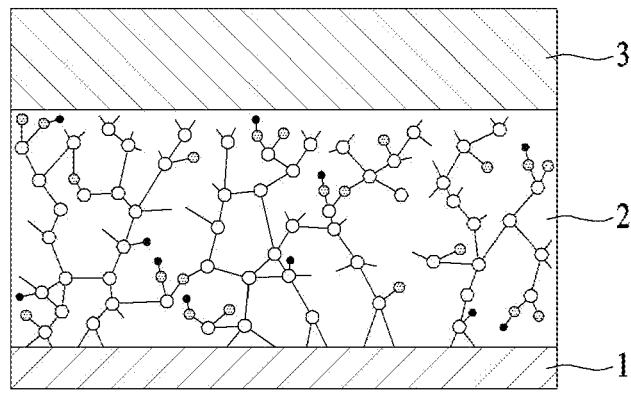

FIG. 2 is a schematic diagram showing a precursor having a methyl group as an end group and FIG. 3 and FIG. 4 are sectional schematic views illustrating an example of a method of doping graphene using substrate surface modification.

As shown in FIG. 3, a precursor polymer layer 2 is formed on the substrate 1 using the precursor having a methyl group ($CH_3$) shown in FIG. 2.

Here, the polymer layer 2 may be formed using plasma enhanced chemical vapor deposition (PECVD).

A polymer such as cyclohexane has a ring shape, but the ring is opened by plasma treatment such as plasma enhanced chemical vapor deposition (PECVD) to produce a radical molecule. Accordingly, the methyl group may be exposed to an end.

As such, the polymer layer 20 having a methyl group exposed to the end enables surface enhancement (modification) of the substrate 1.

Such graphene 3 may be formed on a catalytic metal (not shown) and transferred to the substrate 1 provided with a polymer layer 2.

A catalytic metal may be a metal such as Ni, Co, Fe, Pt, Au, Al, Cr, Cu, Mg, Mn, Mo, Rh, Si, Ta, Ti, W, U, V, Zr or the like, and may be a single layer of any one thereof or an alloy of at least two thereof.

A method of forming graphene 3 includes chemical vapor deposition such as thermal chemical vapor deposition (CVD), inductively coupled plasma chemical vapor deposition (ICP-CVD), plasma enhanced chemical vapor deposition (PE-CVD), microwave CVD or the like. In addition, various methods such as rapid thermal annealing (RTA), atomic layer deposition (ALD) and physical vapor deposition (PVD) may be used.

For example, chemical vapor deposition is a method which grows graphene 3 by placing a catalytic metal in a chamber (not shown), feeding a carbon source thereto and providing suitable growth conditions.

For example, the carbon source can be supplied in a gas form such as methane ($CH_4$) or acetylene ($C_2H_2$), or a solid form such as a powder or a polymer, or a liquid form such as bubbling alcohol.

In addition, a variety of carbon sources such as ethane, ethylene, ethanol, acetylene, propane, butane, butadiene, pentane, pentene, cyclopentadiene, hexane, cyclohexane, benzene and toluene may be used.

When a material which is not deformed at a high temperature, rather than a polymer substrate, is used as the substrate 1, graphene 3 can be directly formed on the substrate 10, instead of transferring the graphene 3 onto the substrate 1.

As described above, the substrate 1 may include a polymer which includes at least one of polyethylene terephthalate (PET), triacetyl cellulose (TAC), and polycarbonate (PC). For example, the substrate 10 may be formed using any one of PEC, TAC and PC.

As shown in FIG. 4, the graphene 3 may be disposed on the substrate 1 provided with the polymer layer 2.

That is, the substrate 1 may be a flexible substrate and the graphene 3 disposed on the flexile substrate may be used as an electrode of a flexible device.

As such, when graphene 3 is disposed on the surface-modified substrate 1, the graphene 3 is doped by a methyl group, thus improving electrical properties.

In addition, this doping effect may be n-type doping or p-type doping.

Figure 5:
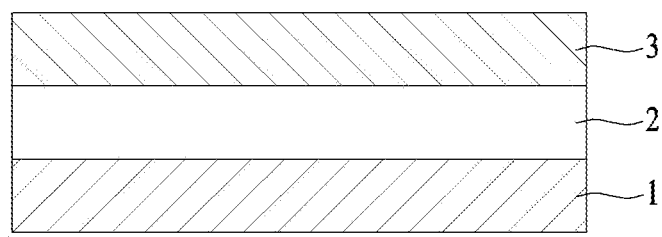
FIGS. 5 to 7 are schematic sectional views illustrating examples of a graphene structure using substrate surface modification.
Figure 6:
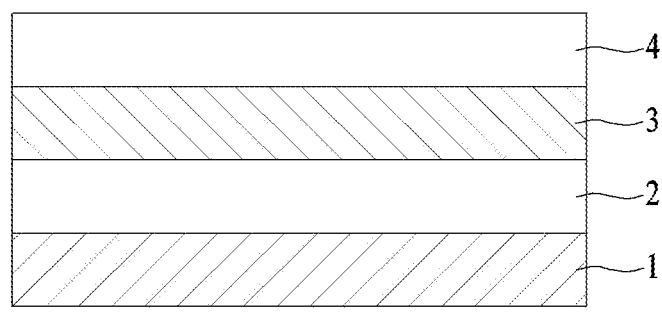
Figure 7:
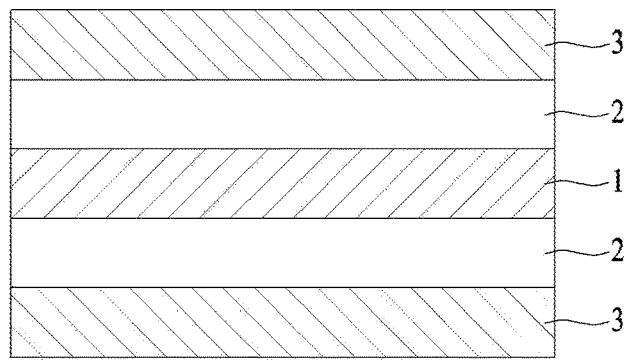

FIGS. 5 to 7 are schematic sectional views illustrating examples of a graphene structure using substrate surface modification.

That is, as shown in FIG. 5, graphene 3 is disposed on a substrate 1 which is surface-modified through a polymer layer 2 having a methyl group at an end thereof, to produce a graphene structure with improved electrical properties, that is, with doping effects.

In addition, as shown in FIG. 6, an additional doping layer 4 may be further included on the graphene structure having a structure shown in FIG. 5.

That is, the graphene 3 disposed on the surface-modified substrate 1 can improve electrical properties through an additional doping process. In addition, as described above, the graphene 3 may exhibit n-type doping or p-type doping properties.

Such a doping process can offset a decrease in conductivity by grain defects (defects at grain boundaries of metals) of graphene formed on a catalytic metal.

That is, the material of the graphene 3 is replaced with a dopant material contained in the doping layer 4, thus generating carriers. Accordingly, carrier density may be increased.

The dopant for doping may include an organic dopant, an inorganic dopant or a combination thereof. For example, a gas or solution of nitric acid and a material containing the same may be used. In particular, vapor phase doping using gas may be more advantageous.

In addition, specifically, examples of this dopant include one or more of $NO_2BF_4$, $NOBF_4$, $NO_2SbF_6$, HCl, $H_3PO_4$, $CH_3COOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoyl phosphatidylinositol, and trifluoromethanesulfonimide.

Meanwhile, as shown in FIG. 7, the surface modification of the substrate 1 may be carried on both sides of the substrate 1. That is, a precursor polymer layer 2 is formed on both surfaces of the substrate 1 and graphene 3 is disposed on the polymer layer 2.

As such, the graphene 3 disposed on the substrate 1 surface-modified by the polymer layer 2 can exhibit greatly improved electrical properties, as described above.

Figure 8:
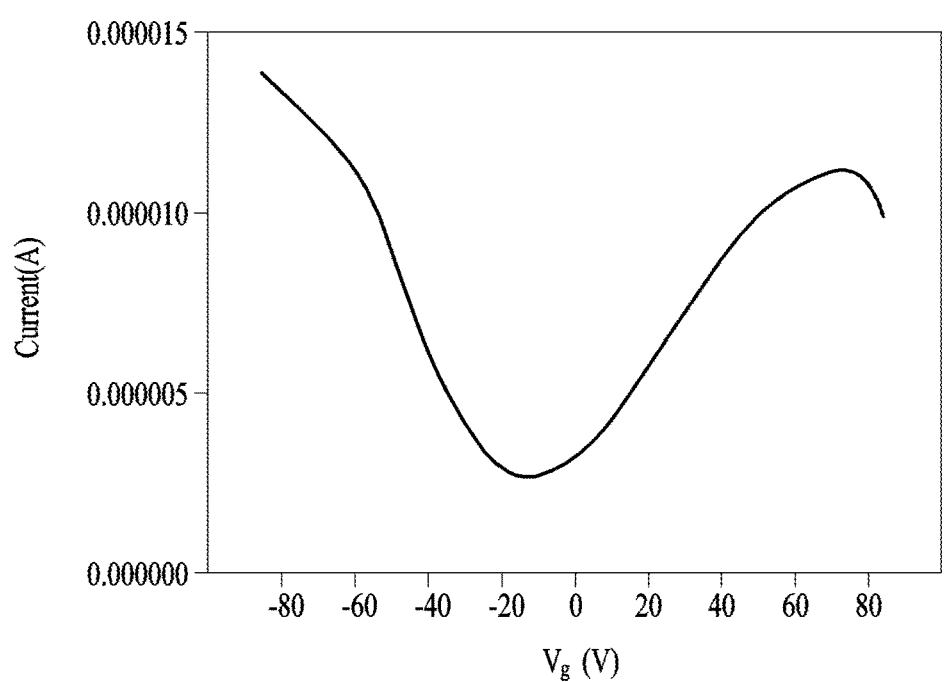
FIG. 8 is a graph showing current properties of graphene related to doping properties.
Figure 10:
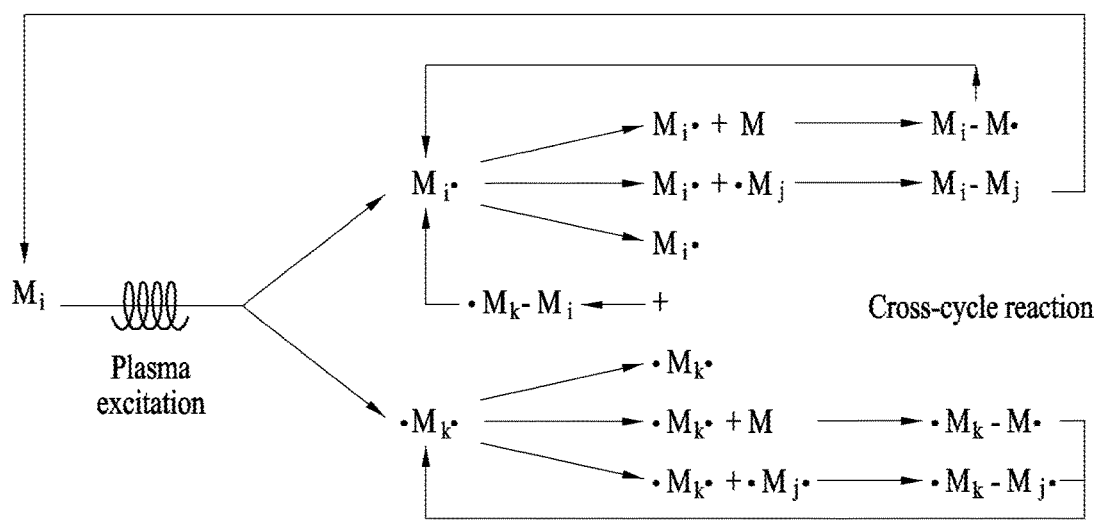
FIGS. 10 and 11 are schematic diagrams illustrating a principle of polymerization using plasma.
Figure 11:
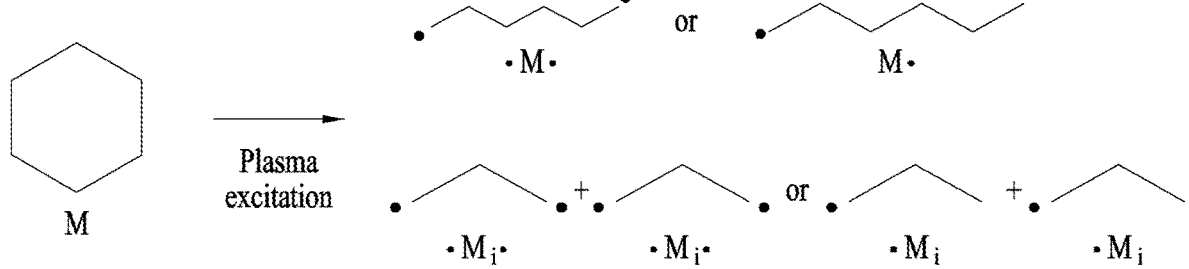

FIG. 8 is a graph showing current properties of graphene related to doping properties. In addition, FIG. 9 is a schematic view showing a PECVD procedure for conducting substrate surface modification, and FIGS. 10 and 11 are schematic diagrams illustrating a principle of polymerization using plasma by PECVD.

Hereinafter, a procedure of substrate surface modification will be described with reference to FIGS. 8 to 11.

As described above, the surface modification of the substrate 1 can be carried out by PECVD.

Figure 9:
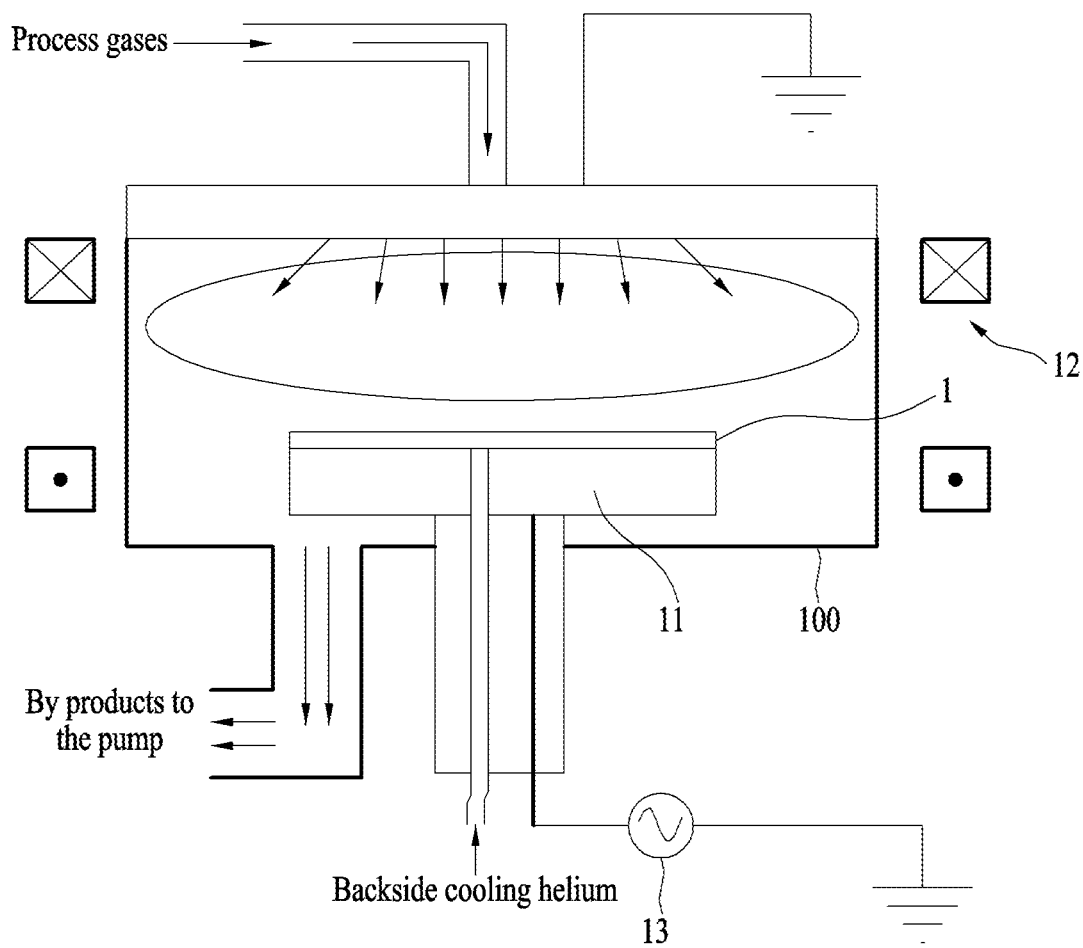
FIG. 9 is a schematic view showing PECVD for conducting substrate surface modification.

As shown in FIG. 9, a PECVD apparatus includes a chamber 100, and a magnetic coil 12 and an RF power supply 13 to generate plasma disposed in the chamber 100, wherein plasma is generated on a chuck 11 on which the substrate 1 is loaded.

Backside cooling helium is supplied to a lower part of the chamber 100 to reduce the temperature of the substrate.

In FIG. 9, process gases are supplied from an upper part and gases after reaction (by-products) are discharged through a pump (not shown) from a lower part.

In accordance with this PECVD method, process gases are adsorbed on the surface of the substrate 1 cooled by the backside cooling helium and process gases activated by plasma react with process gases inactivated thereby to produce a polymer layer.

Here, deposition on the substrate 1 is considered to be adsorption of process gases due to orientation of plasma and low temperature of the surface of the substrate 1.

Hereinafter, a reaction principle of forming this polymer layer will be described.

In FIG. 10, $M_i$ refers to a polymer that is produced from i M molecules. Thus, the subscript "i" means the number (for example, k, j) of molecules that a polymer has.

In addition, dot means a radical form.

One dot means a single radical and two dots means two radicals.

A radical can produce a bond by reaction with other molecules or radicals due to high reactivity of the radical.

Here, "+" means reaction between two materials. The product obtained by reaction between two materials is disposed in a direction of a head of an arrow and a bond occurs after reaction.

In addition, "–" means formation of a bond between molecules.

Through such a process, a polymer layer 2 can be formed by plasma.

Referring to FIG. 11, in the case of cyclohexane having a ring shape, the ring of cyclohexane is opened by plasma treatment under a hydrogen atmosphere in a similar manner to the principle described in FIG. 10, thus forming a radical molecule.

The formed radical molecules having various structures undergo an increase in molecular weight as reaction occurs, like the manner described with reference to FIG. 10.

Through such a process, a precursor polymer layer 2 having a methyl group as an end group is uniformly formed on the substrate 1, and the polymer layer 2 can greatly improve properties of the substrate 1.

FIG. 8 shows properties of graphene when using a polymer layer 2 having a chain precursor such as a methyl group. Doping effects are known to be maximized when a minimum of a current curve reaches around 0V.

As shown in FIG. 8, a minimum of a current curve reaches around 0V. When graphene 3 is disposed on the polymer layer 2, electrical properties of the graphene 3 can be improved by bonding with the polymer layer 2.

In addition, through surface modification of the substrate 1 using the polymer layer 2, in case where additional doping is conducted, it is possible to maximize the effects of doping.

In the present embodiment, an example of using the polymer layer 2 for doping properties including conductivity enhancement has been described, but various properties can be improved depending on the type of the polymer.

For example, the functional group can be changed according to purpose and other properties of graphene can be improved depending on the functional group used.

As a result, it is possible to modify the surface of various substrates promptly at a low cost by using a polymer layer including an organic precursor.

The graphene can be deposited on a flexible insulation material which replaces conventionally used silicon oxide inapplicable to flexible devices and is thus advantageously applicable to flexible devices.

In addition, a graphene structure having high permeability can be manufactured and is thus applicable to optical devices, displays and the like.

Figure 12:
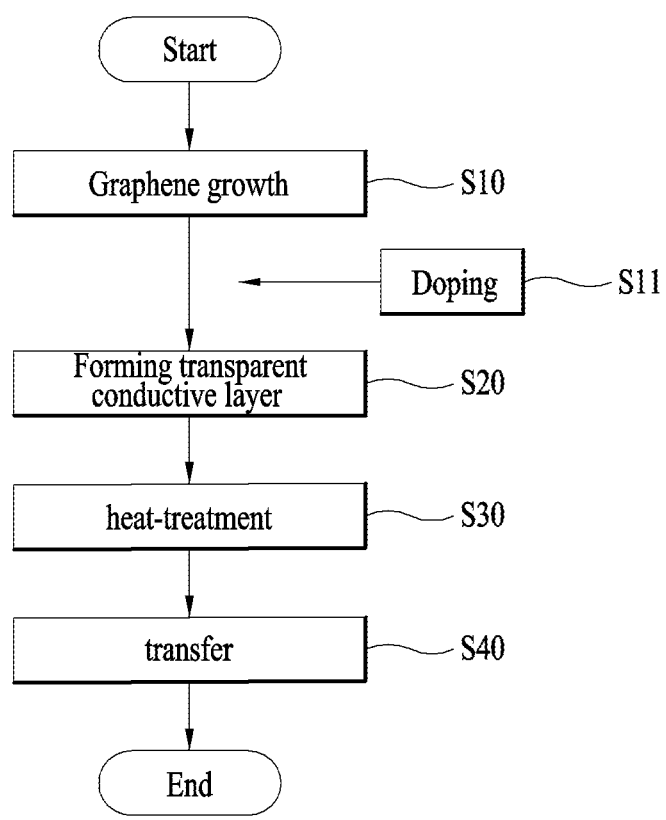
FIG. 12 is a flowchart illustrating an example of a method of manufacturing a graphene composite electrode.

FIG. 12 is a flowchart illustrating an example of a method of manufacturing a graphene composite electrode.

As shown in FIG. 12, the method of manufacturing the graphene composite electrode includes forming graphene on a catalytic metal (S10), forming a transparent conductive layer on the graphene using a transparent conductive oxide (S20), crystallizing the transparent conductive oxide by heat treatment (S30) and transferring a composite electrode including the graphene and the transparent conductive oxide to a final substrate (S40). Hereinafter, respective steps will be described with reference to FIG. 12 and the corresponding drawings.

FIGS. 13 to 20 are schematic sectional views illustrating respective steps of manufacturing a graphene composite electrode.

Figure 13:
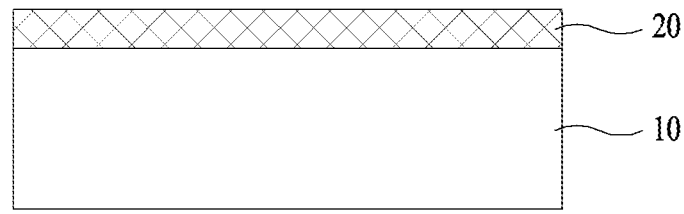
FIGS. 13 to 20 are schematic sectional views illustrating respective steps of manufacturing a graphene composite electrode.

As shown in FIG. 13, in order to produce a composite electrode including graphene, graphene 20 is formed on a catalytic metal 10 (S20).

The catalytic metal 10 may be a metal such as Ni, Co, Fe, Pt, Au, Al, Cr, Cu, Mg, Mn, Mo, Rh, Si, Ta, Ti, W, U, V, or Zr, and may be a single layer of any one thereof or an alloy of at least two thereof.

The method of producing graphene 20 includes chemical vapor deposition such as thermal chemical vapor deposition (CVD), inductively coupled plasma chemical vapor deposition (ICP-CVD), plasma enhanced chemical vapor deposition (PECVD), and Microwave CVD. In addition, various methods such as rapid thermal annealing (RTA), atomic layer deposition (ALD), and physical vapor deposition (PVD) may be used.

For example, chemical vapor deposition is a method which grows graphene 3 by placing a catalytic metal 10 in a chamber (not shown), feeding a carbon source thereto and providing suitable growth conditions.

For example, the carbon source can be supplied in a gas form such as methane ($CH_4$) or acetylene ($C_2H_2$), or a solid form such as a powder or a polymer, or a liquid form such as bubbling alcohol.

In addition, a variety of carbon sources such as ethane, ethylene, ethanol, acetylene, propane, butane, butadiene, pentane, pentene, cyclopentadiene, hexane, cyclohexane, benzene and toluene may be used.

Hereinafter, an example in which copper (Cu) is used as the catalytic metal 10 and methane ($CH_4$) is used as the carbon source will be described.

When methane gas is supplied onto the catalytic metal 10 under a hydrogen atmosphere while maintaining a suitable temperature, hydrogen reacts with methane to form graphene 20 on the catalytic metal 10. Formation of the graphene 20 can be carried out at a temperature of about 300 to about 1,500° C.

At this time, when there is no space on a lower surface of the catalytic metal 10, the graphene 20 can be formed on only an upper surface of the catalytic metal 10. On the other hand, when there is a space on the lower surface of the catalytic metal 10, the graphene 20 can be formed on both surfaces of the catalytic metal 10.

Copper as the catalytic metal 10 can be advantageous in forming mono-layer graphene to low solid solution degree. The graphene 20 may be directly formed on the catalytic metal 10.

The catalytic metal 10 may be supplied in a sheet form, but can be continuously supplied using a roller, or a copper foil with a thickness of about 10 μm to 10 mm can be used as the catalytic metal 10. That is, using a roll-to-roll process, the graphene 20 can be formed on the catalytic metal 10.

When the graphene 20 obtained by the aforementioned process is formed at both surfaces as described above, the graphene 20 formed on one surface of the catalytic metal 10 may be removed.

Through this process, as shown in FIG. 13, the graphene 20 can be formed on one surface of the catalytic metal 10.

Then, doping the graphene 20 (S11) is conducted.

Through this doping process (S11), the conductivity of the graphene 20 can be improved. That is, grain defects resulting from the catalytic metal 10 (defects caused by the grain boundary or the like of the metal) may lead to deterioration in conductivity of the graphene 20. In this regard, the material of the graphene 20 is replaced with the dopant material, which may generate carriers. Accordingly, carrier density may be increased.

The dopant for doping may include an organic dopant, an inorganic dopant or a combination thereof. For example, a gas or solution of nitric acid and a material containing the same may be used. In particular, vapor phase doping using gas may be more advantageous.

In addition, specifically, examples of this dopant include one or more of $NO_2BF_4$, $NOBF_4$, $NO_2SbF_6$, $HCl$, $H_3PO_4$, $CH_3COOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoyl phosphatidylinositol, and trifluoromethanesulfonimide.

Figure 14:
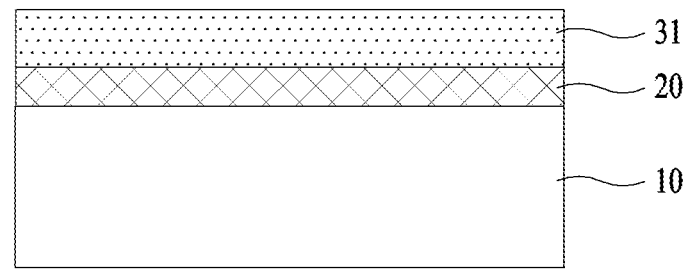

FIG. 14 shows a transparent conductive layer 31 formed on the graphene 20. As such, forming a transparent conductive layer on the graphene 20 using a transparent conductive oxide (S20) is conducted.

Here, the transparent conductive oxide (TCO) may include at least one of indium tin oxide (ITO), indium zinc oxide (IZO), zinc oxide (ZnO), gallium doped zinc oxide (GZO) and aluminum doped zinc oxide (AZO).

Among them, ITO is a material produced by conducting solid solution of $SnO_2$ in $In_2O_3$, which is an oxide having low electrical resistance and being stable at room temperature because it exhibits excellent transmittance in the visible light region, while exhibiting high reflectivity in an infrared light region.

Then, crystallizing the transparent conductive oxide by heat treatment (S30) is conducted.

The step of crystallizing the transparent conductive oxide by heat treatment (S30) may be carried out at a temperature of 150° C. to 400° C.

Figure 15:
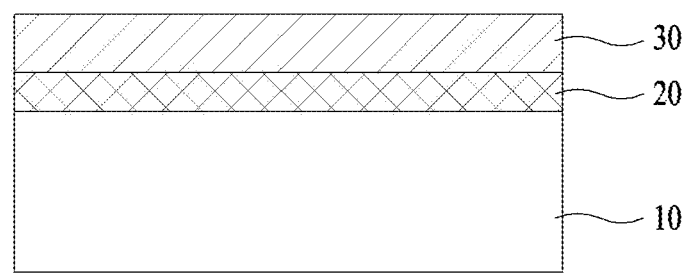

This crystallization S30 can improve crystallinity of the transparent conductive layer 31 and reduce resistance. Thus, as shown in FIG. 15, the crystallized transparent conductive layer 30 may be disposed on the graphene 20.

Figure 21:
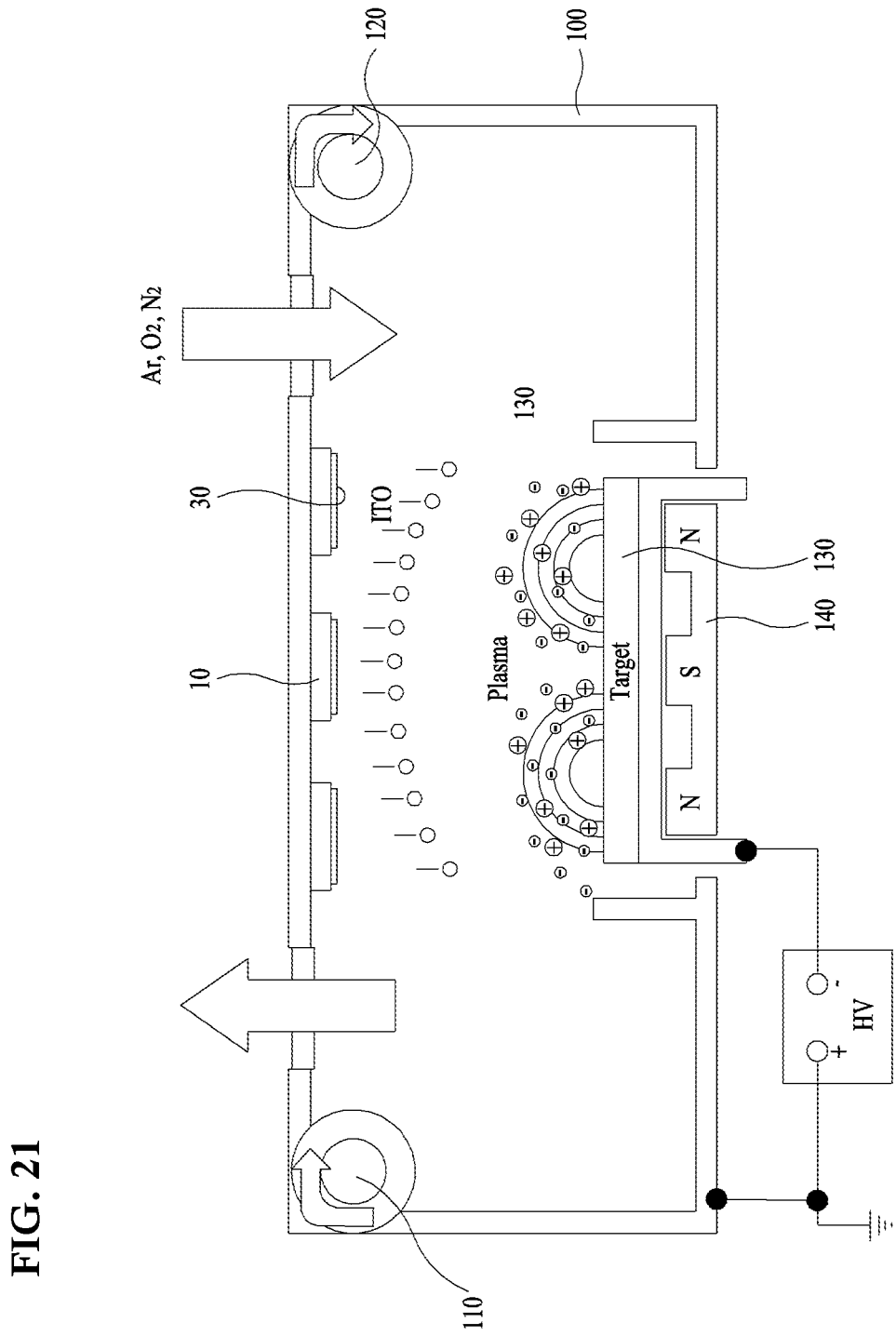
FIG. 21 is a schematic view illustrating a process of forming a transparent conductive layer.

Formation of the transparent conductive layer 31 (S20) and crystallization (S30) can be carried out using a sputtering device shown in FIG. 21.

FIG. 21 is a schematic view illustrating a process of forming a transparent conductive layer according to the present invention.

First, primarily, the vacuum level of the chamber 100 is formed to 10 mTorr using a first vacuum pump (rotary pump; 110) and secondarily the vacuum level is formed to $3 \times 10^{-6}$ mTorr using a second vacuum pump (diffusion pump; 120).

An RF power supply 150 has a power of 300 W or higher and this may be adjusted upwardly or downwardly. The frequency applied is typically about 14 MHz, which may be adjusted upwardly or downwardly.

Ar injection may be conducted to produce plasma and a small amount of oxygen may be injected together with the Ar to perform crystallization (S30).

Through this process, ITO 30 may be formed on the graphene 20 formed on the catalytic metal 10, and the graphene 20 is omitted as shown in FIG. 21.

When plasma is produced at a side of a target 130 upon application of power from the RF power supply 150, the target 130 evaporates and ITO is formed as a transparent conductive layer 30 on the graphene 20. A permanent magnet 140 may be disposed under the target 130.

Hereinafter, an example in which the crystallized transparent conductive layer 30 is an ITO layer will be described.

The transparent conductive layer 30 formed on the graphene 20 can produce a transparent composite electrode. That is, through the organic/inorganic hybrid of the graphene 20 and the ITO layer 30, a transparent composite electrode having low resistance can be formed.

Such a composite electrode is applicable to a sputtering method which is currently industrially available. This can cause a ⅕ decrease in amount of ITO used. This is because the composite electrode satisfies all of conditions for the transparent electrode although it is formed at a small thickness.

In addition, the ITO layer 30 can function as a protection film of the graphene 20. When the graphene 20 is doped, the effect of doping can be maintained for a longer time.

Then, transferring a composite electrode including the graphene and the transparent conductive oxide to a final substrate (S40) is conducted.

The transfer (S40) may be broadly carried out by two methods.

First, a temporary support layer is used.

Figure 16:
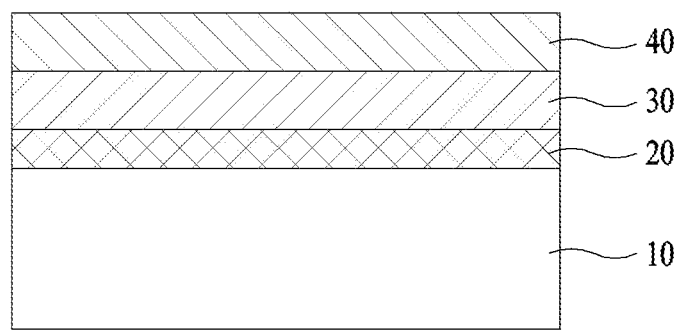

For this purpose, as shown in FIG. 16, a support layer is disposed on an ITO layer 30. The support layer 40 may be adhered to the ITO layer 30 or directly formed thereon. The support layer 40 adhered to the ITO layer 30 may be a transfer film. The transfer film includes an adhesive layer and can be easily removed from the ITO layer 30 because it loses adhesion upon subsequent application of heat or light.

In addition, the adhesive layer may be a reworkable adhesive agent. That is, the adhesive layer can be easily detached during or after a process, and does not leave resides behind even after detachment.

Figure 17:
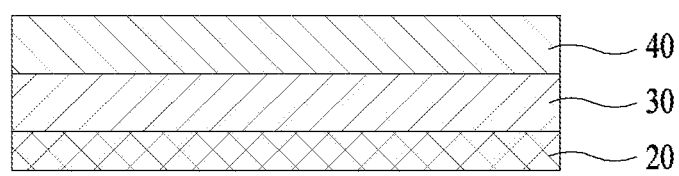

Next, as shown in FIG. 17, removal of the catalytic metal 10 is conducted.

Then, the final substrate 50 may be adhered to the surface from which the catalytic metal 10 is removed. In some cases, the final substrate 50 may be directly formed on the surface from which the catalytic metal 10 is removed.

The final substrate 50 may mean a layer which can be applied to an electronic device together with the graphene 20.

That is, the final substrate 50 may be a transparent or non-transparent substrate which can be directly used for various display devices and may be a substrate directly used for devices such as touch panels.

The final substrate 50 may be a polymer material such as polyethylene terephthalate (PET), triacetyl cellulose (TAC), and polycarbonate (PC), or a semiconductor wafer such as silicon (Si). Furthermore, any member may be used without limitation so long as it is a transparent or non-transparent film.

Figure 18:
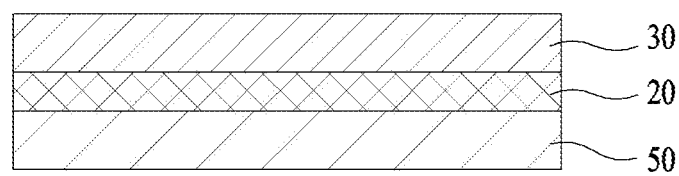
Figure 19:
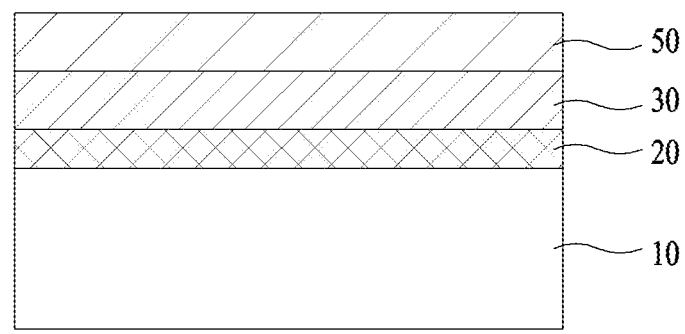

Then, the method may include removing the support layer 40. When the support layer 40 is removed, the composite electrode including the graphene 20 and the ITO layer 30 is disposed on the final substrate 50, as shown in FIG. 18.

Meanwhile, without using a support layer, the final substrate 50 may be directly adhered to or formed on the ITO layer 30 for transfer.

Then, the catalytic metal 10 may be removed.

Figure 20:
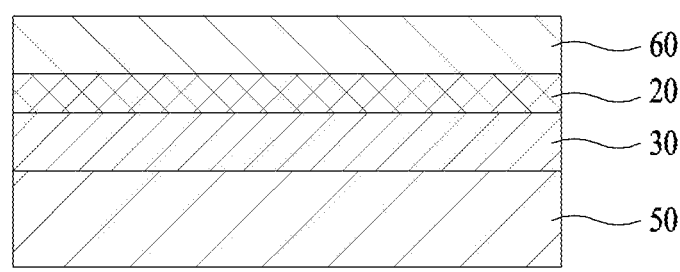

Through this transfer method, the composite electrode including the graphene 20 and the ITO layer 30 can be disposed on the final substrate 50. However, as shown in FIG. 20, the ITO layer 30 is disposed directly on the final substrate 50.

As such, a flexible transparent electrode can be produced using the composite electrode transferred to the final substrate 50. That is, the composite electrode imparts both conductivity and flexibility, thus removing limitations of flexible displays which could not be overcome only with an ITO layer.

As described above, the present process is applicable to an ITO roll-to-roll process, and can be used in combination with a roll-to-roll-based graphene synthesis process.

Through the hybrid of this two-dimensional material the graphene 20 and the ITO layer 30, the transparent composite electrode can be produced and the composite electrode including graphene 20 includes an organic material (graphene) and, in particular, thus exhibits excellent adhesion to an organic EL display.

Accordingly, as shown in FIG. 20, the method may further include forming an organic EL layer 60 on the graphene 20. As such, the composite electrode produced according to the present invention can be used as a transparent electrode, in particular, a flexible electrode, of an organic EL display. However, the subject applied is not limited to the organic EL display.

As described above, the composite electrode including the graphene 20 and the ITO layer 30 can be heat-treated at a temperature of 150° C. to 400° C., thus greatly improving conductivity. In cases where only an ITO disposed on a conventional polymer substrate is used for a transparent electrode, heat-treatment at a temperature of 150° C. or higher cannot be conducted. Accordingly, the transparent electrode produced according to the present invention can greatly improve conductivity, as compared to the conventional case.

In addition, as a result, the thickness of the electrode can be reduced to half or less under the same conductivity, which means that the material for the electrode used is reduced.

Meanwhile, although embodiments according to the present invention disclosed in the specification and the drawings have been provided as specific examples for illustrative purposes, they should not be construed as limiting the scope of the present invention. It will be apparent to those skilled in the art that various modifications and variations can be made in the present invention without departing from the spirit or scope of the invention.

INDUSTRIAL APPLICABILITY

The surfaces of various substrates can be modified using a polymer layer including an organic precursor rapidly and at low cost.

The graphene can be deposited on a flexible insulation material which replaces conventionally used silicon oxide inapplicable to flexible devices and is thus advantageously applicable to flexible devices.

In addition, graphene structures having high permeability can be manufactured and are thus applicable to optical devices, displays and the like.

Graphene disposed on a surface-modified substrate can exhibit improved electrical properties.

Meanwhile, the transparent conductive layer formed on the graphene can produce a transparent composite electrode. That is, a transparent composite electrode having low resistance can be formed through organic/inorganic hybrid of graphene and an ITO layer.

The invention claimed is:

1. A method of doping graphene using substrate surface modification comprising:
    forming a precursor polymer layer for doping on a substrate; and
    disposing graphene on the substrate provided with the precursor polymer layer,
    wherein the precursor polymer layer includes a precursor having plasma-treated cyclohexane such that a methyl group is exposed to an end of the precursor, and
    wherein the precursor has an open ring structure of cyclohexane by plasma treatment to form a radical molecule.

2. The method according to claim 1, wherein the substrate is a polymer substrate.

3. The method according to claim 2, wherein the polymer substrate comprises at least one of polyethylene terephthalate (PET), triacetyl cellulose (TAC), and polycarbonate (PC).

4. The method according to claim 1, wherein the formation of the precursor polymer layer is carried out using plasma enhanced chemical vapor deposition.

5. The method according to claim 1, further comprising: doping the graphene.

6. The method according to claim 1, wherein a surface modification is performed by the methyl group exposed to the end.

7. The method according to claim 1, wherein the surface modification is performed on both sides of the substrate.

8. The method according to claim 1, wherein the graphene is doped by the methyl group exposed to the end.

9. The method according to claim 8, further comprising doping the graphene on the substrate.

10. The method according to claim 1, wherein the formed radical molecules undergo an increase in molecular weight as reaction occurs, whereby the precursor polymer layer having a methyl group as the end is uniformly formed on the substrate so as to improve property of the substrate.

* * * * *